(12) United States Patent  
 Danjo

(10) Patent No.: US 9,154,120 B2  
(45) Date of Patent: Oct. 6, 2015

(54) ELECTRONIC CIRCUIT

(71) Applicant: FUJITSU LIMITED, Kawasaki-shi, Kanagawa (JP)

(72) Inventor: Takumi Danjo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/321,644

(22) Filed: Jul. 1, 2014

(65) Prior Publication Data

US 2015/0029049 A1   Jan. 29, 2015

(30) Foreign Application Priority Data

Jul. 25, 2013 (JP) ................................. 2013-154795

(51) Int. Cl.
*H03K 19/0175* (2006.01)
*H03K 5/24* (2006.01)
*H03F 3/00* (2006.01)

(52) U.S. Cl.
CPC ................ *H03K 5/2481* (2013.01); *H03F 3/00* (2013.01); *H03K 5/249* (2013.01)

(58) Field of Classification Search
CPC ... H03K 5/2481; H03K 5/249; H03K 5/2418; H04L 25/0269; H03F 3/45183
USPC ............................................ 327/65; 341/155
See application file for complete search history.

(56) References Cited

U.S. PATENT DOCUMENTS

| 6,822,596 B2 * | 11/2004 | Theiler .......................... 341/155 |
| 6,850,178 B2 * | 2/2005 | Watanabe ...................... 341/155 |
| 7,589,659 B2 * | 9/2009 | Hurrell ........................... 341/163 |
| 8,130,130 B2 * | 3/2012 | Danjo et al. .................. 341/158 |
| 8,339,296 B2 * | 12/2012 | Danjo ............................ 341/118 |
| 8,604,835 B2 * | 12/2013 | Kuroki et al. ..................... 327/9 |
| 2011/0234440 A1 | 9/2011 | Danjo |

FOREIGN PATENT DOCUMENTS

| JP | 2011-223553 A | 11/2011 |
| JP | 2013-070156 A | 4/2013 |

* cited by examiner

*Primary Examiner* — Lincoln Donovan  
*Assistant Examiner* — Diana J Cheng  
(74) *Attorney, Agent, or Firm* — Arent Fox LLP

(57) ABSTRACT

An electronic circuit includes: a pair of first transistors in which a first control signal is inputted to at least one of a first control terminal; a comparator circuit that sets electric potentials of a pair of differential output terminals based on an electric current flowing through the pair of first transistors; second transistors that are coupled in series in a path between an electric power source and a node from at least one of the pair of differential output terminals and between the corresponding pair of first transistors, and having a second control terminals to which a second control signal is inputted; first switches that are respectively coupled in series to the second transistors in the path and that are turned ON in synchronization with a clock signal; and a generation circuit that generates the second control signal based on the clock signal.

9 Claims, 17 Drawing Sheets

ELECTRONIC CIRCUIT

CROSS-REFERENCE TO RELATED APPLICATION

This application is based upon and claims the benefit of priority of the prior Japanese Patent Application No. 2013-154795, filed on Jul. 25, 2013, the entire contents of which are incorporated herein by reference.

FIELD

The embodiments discussed herein are related to an electronic circuit and in relate to, for example, an electronic circuit that includes a comparator circuit.

BACKGROUND

A comparator compares, for example, analog differential input signals and converts the signals to digital signals. A comparator includes an offset due to variations in transistors or due to asymmetrical layouts. The offset corresponds to the amount by which a threshold (difference between differential input signals that are determined by high and low levels of a digital signal) is shifted from zero. The offset adversely affects circuit operations. The threshold may be set to a value other than zero.

The following are reference documents.
[Document 1] Japanese Laid-open Patent Publication No. 2011-223553 and
[Document 2] Japanese Laid-open Patent Publication No. 2013-70156.

SUMMARY

According to an aspect of the invention, an electronic circuit includes: a pair of first transistors in which a first control signal is inputted to at least one of a first control terminal; a comparator circuit that sets electric potentials of a pair of differential output terminals based on an electric current flowing through the pair of first transistors; second transistors that are coupled in series in a path between an electric power source and a node from at least one of the pair of differential output terminals and between the corresponding pair of first transistors, and having a second control terminals to which a second control signal is inputted; first switches that are respectively coupled in series to the second transistors in the path and that are turned ON in synchronization with a clock signal; and a generation circuit that generates the second control signal based on the clock signal so that the second transistors are turned ON with a delay in comparison to the first switches.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
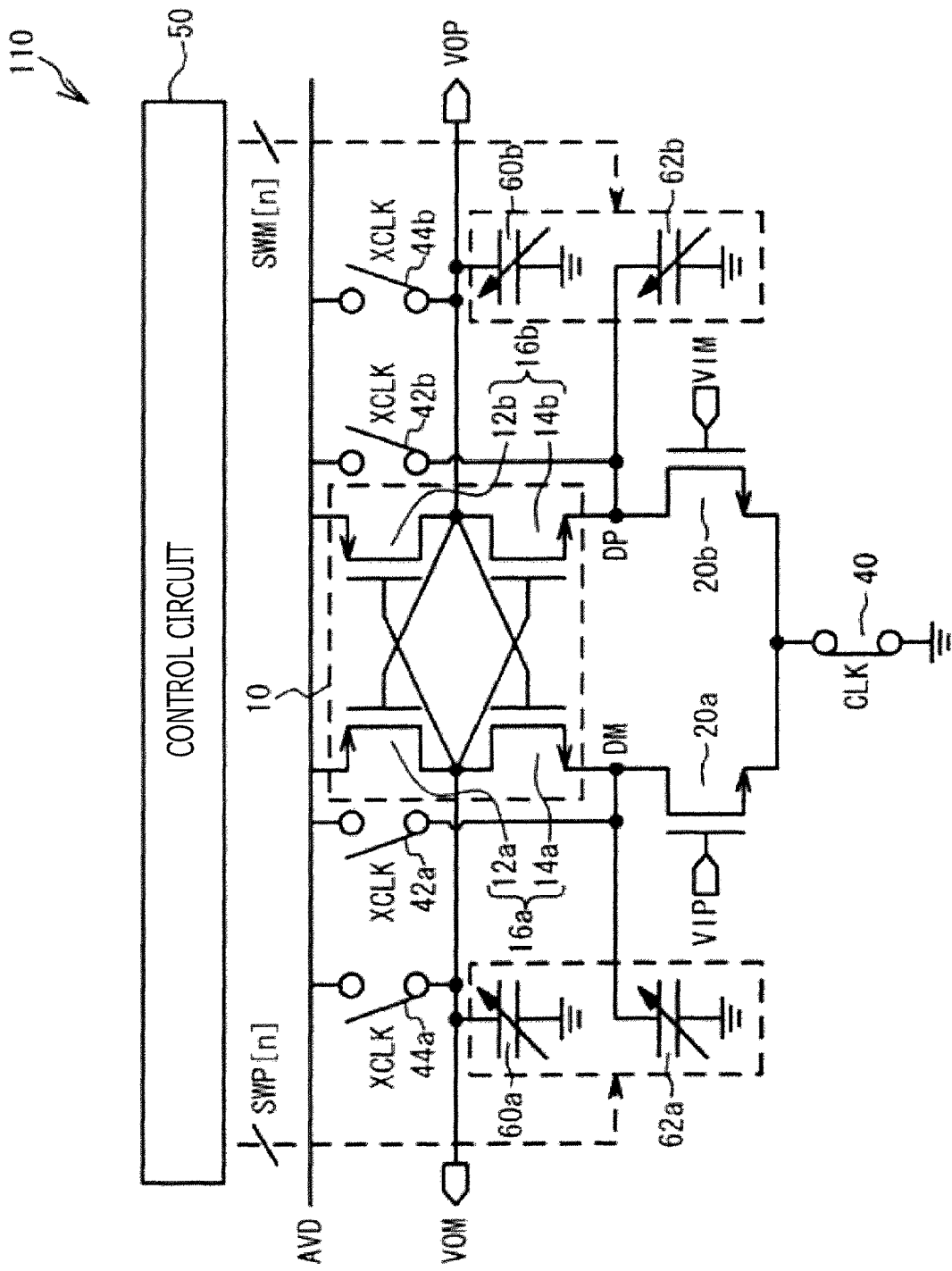
FIG. 1 is a circuit diagram of an electronic circuit according to a first comparative example.

FIG. 1 is a circuit diagram of an electronic circuit according to a first comparative example. As illustrated in FIG. 1, an electronic circuit 110 is provided with a bistable circuit 10, transistors 20a and 20b, switches 40, 42a, 42b, 44a, and 44b, variable capacitors 60a, 60b, 62a and 62b, and a control circuit 50.

The bistable circuit 10 is provided with a pair of inverters 16a and 16b. An input of the inverter 16a is coupled to an output of the inverter 16b and an input of the inverter 16b is coupled to an output of the inverter 16a. The inverter 16a is provided with transistors 12a and 14a. The transistor 12a is a p-type field effect transistor (FET). The transistor 14a is an n-type FET. A source of the transistor 12a is coupled to an electric power source AVD (second electric power source) and a source of the transistor 14a is coupled to a node DM. Drains of the transistors 12a and 14a are both coupled to an output terminal VOM. The inverter 16b is provided with transistors 12b and 14b. The transistors 12b and 14b are respectively p-type and n-type FETs. A source of the transistor 12b is coupled to the electric power source AVD and a source of the transistor 14b is coupled to a node DP. Drains of the transistors 12b and 14b are both coupled to an output terminal VOP. The sources of the transistors 14a and 14b correspond to a pair of first electric power source terminals of the bistable circuit 10, and the sources of the transistors 12a and 12b correspond to a pair of second electric power source terminals of the bistable circuit 10.

The transistors 20a and 20b are n-type FETs. Sources (first terminals) of the transistors 20a and 20b are both coupled to a ground (first electric power source having a voltage different from that of the second electric power source) via the switch 40. Drains (second terminals) of the transistors 20a and 20b are respectively coupled to the nodes DM and DP and are coupled to the electric power source AVD via the bistable circuit 10. The pair of first electric power source terminals in the bistable circuit 10 are coupled to the drains of the transistors 20a and 20b in this way. The pair of second electric power source terminals of the bistable circuit 10 are coupled to the electric power source AVD. Gates (control terminals) of the transistors 20a and 20b are respectively coupled to input terminals VIP and VIM. The switch 40 turns ON when a clock signal CLK is at a high level and turns OFF when the clock signal CLK is at a low level.

The nodes DM and DP are respectively coupled via the switches 42a and 42b to the electric power source AVD. The output terminals VOM and VOP are respectively coupled via the switches 44a and 44b to the electric power source AVD. The switches 42a, 42b, 44a and 44b turn ON when a clock signal XCLK is at a high level and turn OFF when the clock signal XCLK is at a low level. The clock signal XCLK is a complementary signal of the clock signal CLK.

The variable capacitors 60a, 60b, 62a and 62b are respectively coupled to the output terminals VOM and VOP and to the nodes DM and DP, and the other ends thereof are coupled to grounds. The control circuit 50 controls the capacity values of the variable capacitors 60a, 60b, 62a and 62b.

The output terminals VOM and VOP and the nodes DM and DP are at a high level when the clock signal CLK is at a low level in the electronic circuit 110. The electronic circuit 110 begins to operate when the clock signal CLK reaches a high level. When operation begins, the electric potential of the input terminal VIP may be higher than the electric potential of the input terminal VIM. The transistor 20a emits an electric current more often than that of the transistor 20b. As a result, the electric potential of the node DM falls earlier than that of the node DP. The electric potential of the output terminal VOM falls earlier than the electric potential of the output terminal VOP. Consequently, the bistable circuit 10 is stabilized due to the output terminal VOM entering a low level and the output terminal VOP entering a high level. As a result, digital signals are outputted to the output terminals VOM and VOP based on a differential between the analog differential signals inputted to the input terminals VIP and VIM.

The control circuit 50 makes the capacity values of the variable capacitors 60a and 60b asymmetric and makes the capacity values of the variable capacitors 62a and 62b asymmetric. As a result, a threshold of the electronic circuit 110 may be controlled.

However, the capacities are coupled to the output terminals VOM and VOP and the nodes DM and DP in the electronic circuit 110. As a result, operation of the electronic circuit 110 becomes slower.

Figure 2:
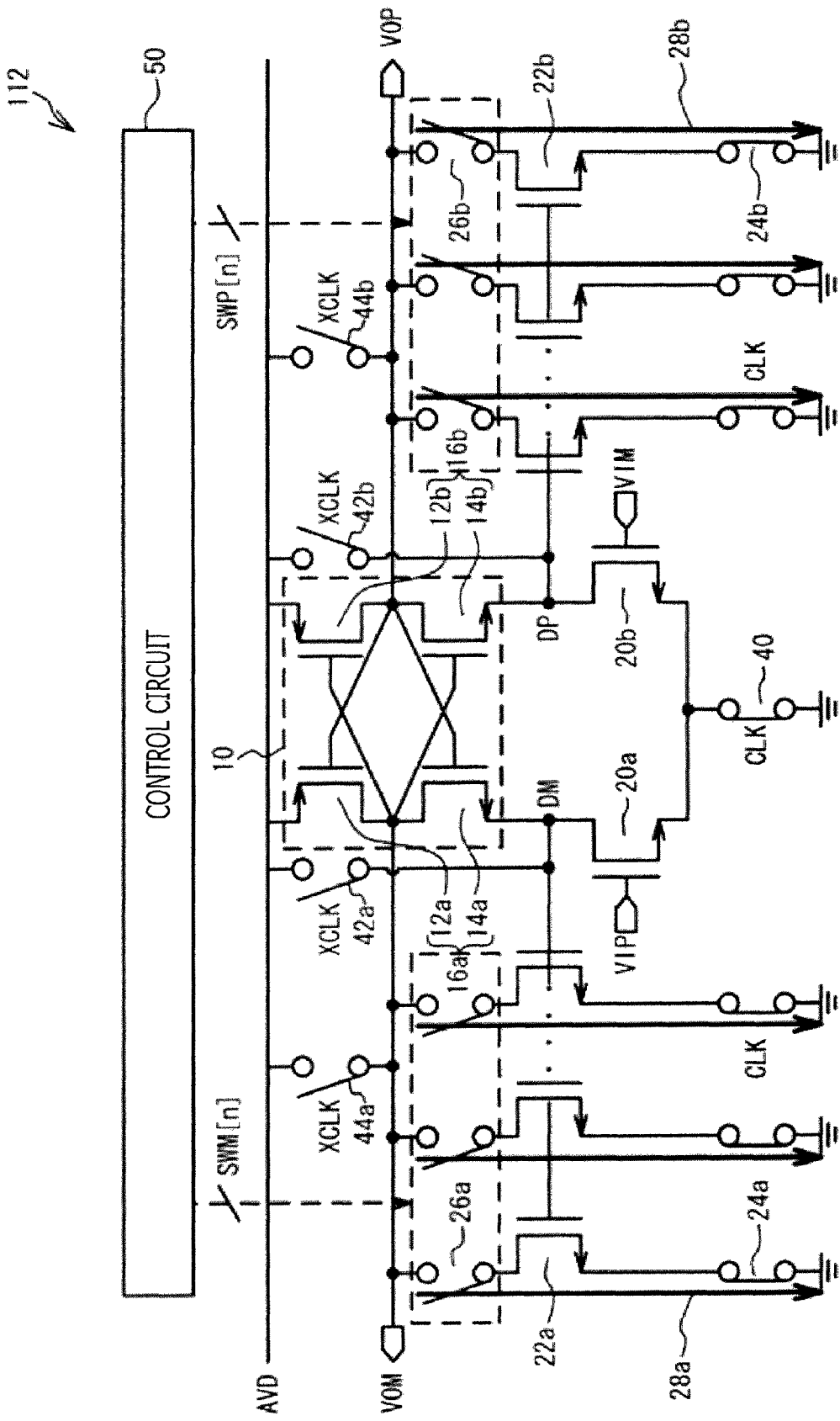
FIG. 2 is a circuit diagram of an electronic circuit according to a second comparative example.

The following is an explanation of a second comparative example which has a greater operation speed than that of the first comparative example. FIG. 2 is a circuit diagram of an electronic circuit according to the second comparative example. As illustrated in FIG. 2, a plurality of paths 28a and 28b are respectively coupled between the output terminals VOM and VOP and grounds in an electronic circuit 112. The switches 26a and 26b, the transistors 22a and 22b, and the switches 24a and 24b are respectively coupled in parallel in the paths 28a and 28b. The gates (control terminals) of the transistors 22a and 22b are respectively coupled to the nodes DM and DP. The sources (first terminals) of the transistors 22a and 22b are respectively coupled via the switches 24a and 24b to the grounds. The drains (second terminals) of the transistors 22a and 22b are respectively coupled to the output terminals VOM and VOP via the switches 26a and 26b. The switches 24a and 24b turn ON when the clock signal CLK is at a high level and turn OFF when the clock signal CLK is at a low level.

The switches 26a and 26b respectively turn ON when switch signals SWM[n] and SWP[n] are in a high level and turn OFF when the switch signals SWM[n] and SWP[n] are in a low level. The switch signals SWM[1] to SWM[n] respectively correspond to n number of the switches 26a. The switch signals SWP[1] to SWP[n] respectively correspond to n number of the switches 26b. The control circuit 50 controls the number of switches that are ON among the switches 26a and the number of switches that are ON among the switches 26b in accordance with an adjustment amount of a threshold. Other configurations are the same as those of the first comparative example and thus explanations thereof are omitted.

Figure 3:
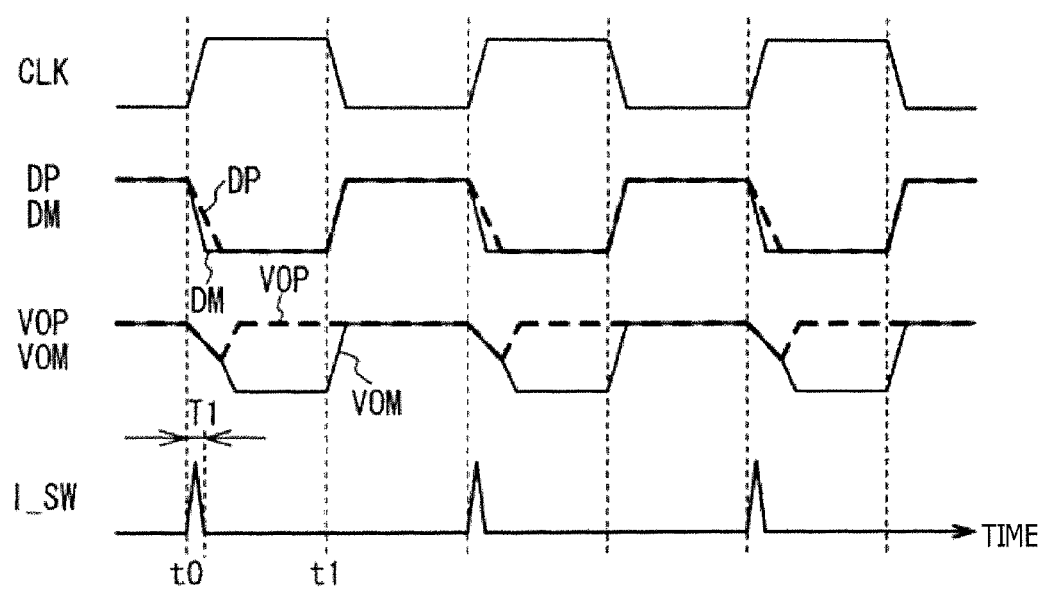
FIG. 3 is a timing chart of electric potentials and electric currents in the second comparative example.

FIG. 3 is a timing chart of electric potentials and electric currents in the second comparative example. The electric potential of the clock signal CLK, the electric potentials of the nodes DP and DM, the electric potentials of the output terminals VOP and VOM, and the electric currents I_SW flowing through the paths 28a and 28b are depicted in relation to time. As illustrated in FIG. 3, the switch 40 turns ON when the clock signal enters a high level at a time t0. The electric potentials of the nodes DP and DM enter a low level in response to the conductance of the transistors 20a and 20b. At this time, the electric potential of the input terminal VIP is higher than that of the input terminal VIM, and the conductance of the transistor 20a is higher than that of the transistor 20b. The electric potential of the node DM reaches a low level earlier than the node DP. When the electric potential of the output terminal VOM decreases earlier than that of the output terminal VOP, the bistable circuit 10 is stabilized due to the output terminal VOM reaching a low level and the output terminal VOP reaching a high level. The rate of change of the nodes DM and DP changing from a high level to a low level is slower than the rate of change of the clock signal CLK changing from a low level to a high level. Therefore, a time period T1 is developed in which both the transistor 22a and the switch 24a are ON. During the time period T1, an electric current flows from the output terminal VOM through the path 28a to the ground. The same happens in the path 28b.

The control circuit 50 controls which of the switches 26a and 26b turns ON and thus the threshold may be controlled at an earlier time in the comparing operation. For example, an offset amount of a threshold is beforehand and the switch signals SWP[n] and SWM[n] are set in the same way as in Japanese Laid-open Patent Publication No. 2013-70156. For example, all of the switches 26b are turned OFF and at least a portion of the switches 26a are turned ON based on the switch signals SWP[n] and SWM[n]. As a result, the electrical charge of the output terminal VOM is extracted and the electric potential falls during the initial period of the comparing operation. In this way, the electric current I_SW flows through the path 28a during the time period T1. As a result, the threshold of the comparator may be controlled. Thus the offset of the threshold may be compensated. Moreover, the threshold may be set to any value due to the control of the switch signals SWP[n] and SWM[n].

In the second comparative example, the variable capacitors are not coupled to the output terminals VOM and VOP nor to the node DM and DP as in the first comparative example. As a result, the operation speed of the electronic circuit 112 may be increased. However, the gates of the transistors 22a and 22b are respectively coupled to the nodes DM and DP. As a result, a load of the gate capacity amount is applied to the nodes DM and DP. Thus the operating speed of the electronic circuit 112 is decreased.

Embodiment 1

Figure 4:
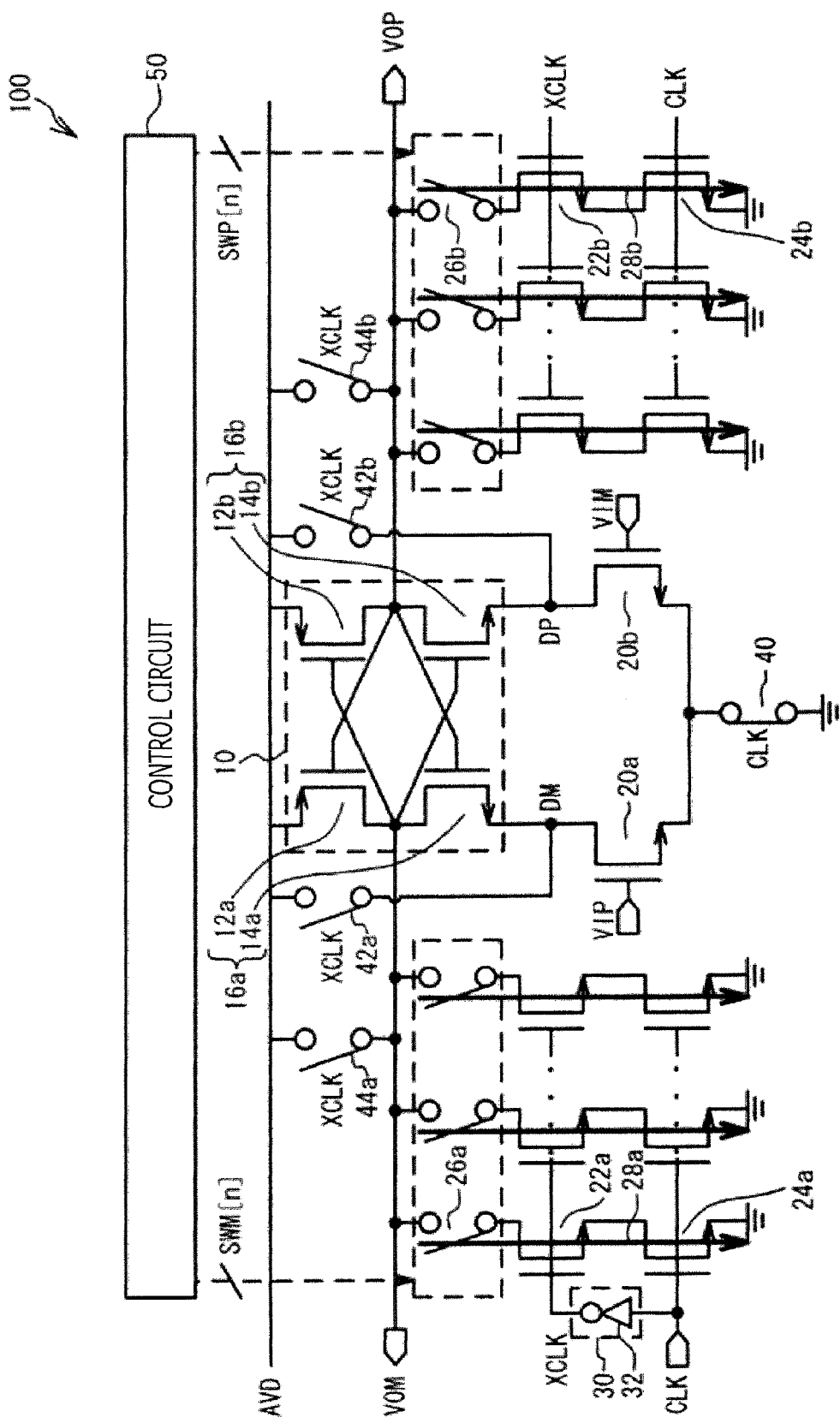
FIG. 4 is a circuit diagram of an electronic circuit according to a first embodiment.

FIG. 4 is a circuit diagram of an electronic circuit according to a first embodiment. As illustrated in FIG. 4, the electronic circuit 100 is provided with a generation circuit 30. The generation circuit 30 is provided with an inverting circuit 32. The inverting circuit 32 supplies the clock signal XCLK, which is inverted from the clock signal CLK, to the gates of the transistors 22a and 22b as a control signal. In this way, the gates of the transistors 22a and 22b are not coupled to the respective nodes DM and DR The switches 24a and 24b are n-type FET switches. The clock signal CLK is inputted to the gates in the n-FETs. Other configurations are the same as those of the second comparative example and explanations thereof are omitted.

Figure 5:
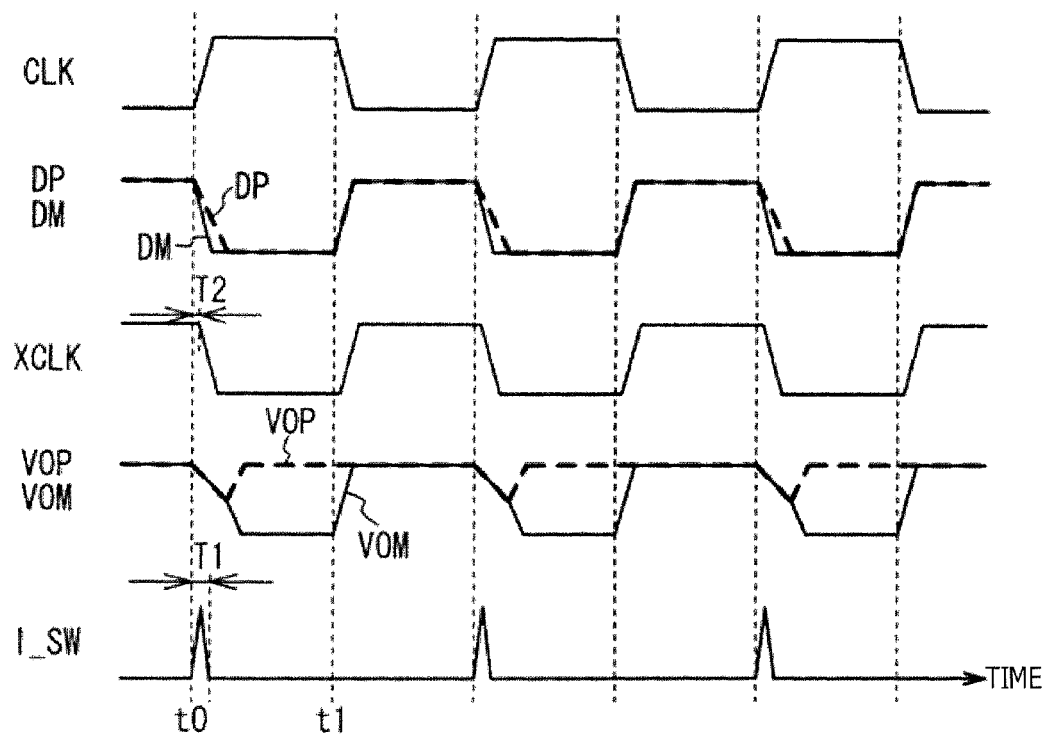
FIG. 5 is a timing chart of electric potentials and electric currents in the first embodiment.

FIG. 5 is a timing chart of electric potentials and electric currents in the first embodiment. The electric potential of the clock signal CLK, the electric potentials of the nodes DP and DM, the electric potential of the clock signal XCLK, the electric potentials of the output terminals VOP and VOM, and the electric currents flowing through the paths 28a and 28b are depicted in relation to time. As illustrated in FIG. 5, the clock signal XCLK is an inverted signal of the clock signal CLK, but the inverting circuit 32 is delayed more than the clock signal CLK by a delay time period T2. Specifically, the fall of the clock signal XCLK is delayed more than the fall of the clock signal CLK by the time period T2. Therefore, the time period T1 is developed in which both the transistor 22a and the switch 24a are ON. During the time period T1, an electric current flows from the output terminal VOM through the path 28a to the ground. The same happens in the path 28b. Other configurations are the same as those of the second comparative example and explanations thereof are omitted.

Figure 6A:
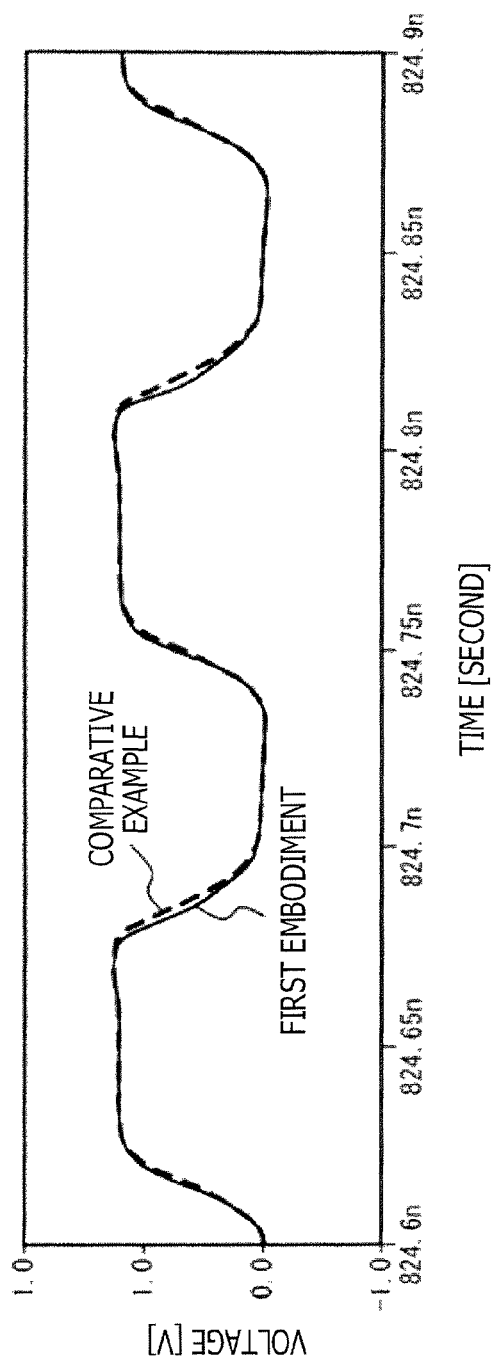
FIG. 6A and FIG. 6B respectively illustrate results of simulations regarding electric potentials of output terminals and nodes in the second comparative example and in the first embodiment.
Figure 6B:
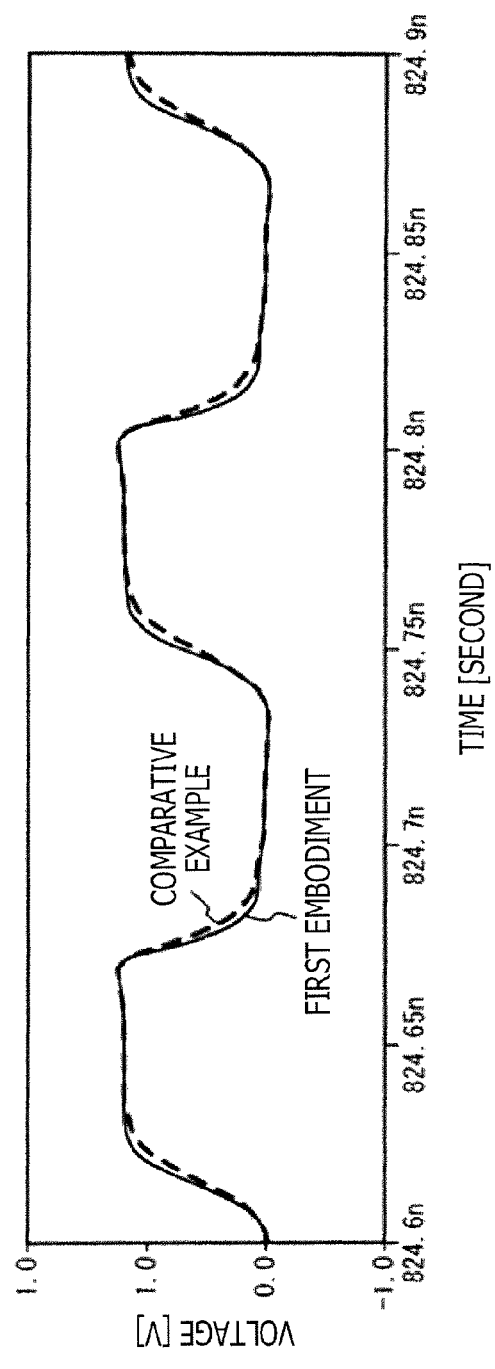

FIG. 6A and FIG. 6B respectively illustrate results of simulations regarding electric potentials of the output terminals and the nodes in the second comparative example and in the first embodiment. The clock frequency is set to 7.5 GHz and both the switches 26a and 26b are turned OFF. FIG. 6A illustrates changes over time of the voltage of the output terminal VOM and FIG. 6B illustrates changes over time of the voltage of the node DM. The solid line represents the first embodiment and the dashed line represents the second comparative example. As illustrated in FIGS. 6A and 6B, the rises and falls of the output terminal VOM and the node DM according to the first embodiment are earlier than those of the second comparative example.

According to the first embodiment, a first control signal (e.g., a differential input signal) is inputted to at least one of the gates (first control terminal) of the pair of transistors 20a and 20b (first transistors). The bistable circuit 10 (comparator circuit) sets the electric potentials of the pair of differential output terminals VOM and VOP based on the electric current flowing through the pair of transistors 20a and 20b. The transistors 22a and 22b (second transistors) are coupled in series in the pair of paths 28a and 28b between the grounds (electric power source) and the pair of differential output terminals VOM and VOP. The signal XCLK (second control signal) is inputted to the gates (second control terminals) of the transistors 22a and 22b. The switches 24a and 24b are respectively coupled in series to the transistors 22a and 22b and are turned ON in synchronization with the clock signal CLK. The generation circuit 30 generates the signal XCLK based on the clock signal CLK to arrive at a state in which the transistors 22a and 22b are turned ON with a delay in comparison to the pair of switches 24a and 24b.

In this way, the gates of the transistors 22a and 22b are not coupled to the respective nodes DM and DP due to the generation circuit 30 generating the signal XCLK based on the clock signal CLK. Consequently, the circuit operation may be conducted at high speed.

Moreover, the switches 26a and 26b are respectively coupled in series to the pair of transistors 20a and 20b which are provided as a plurality. The control circuit 50 causes the pair of switches 26a and 26b to turn ON or OFF individually in the same way as the second comparative example. In this way, the threshold may be controlled by controlling the switches 26a and 26b being turned ON and OFF. The transistor 20a and the switches 24a and 26a may be placed in any order in the path 28a so long as the transistor 20a and the switches 24a and 26a are coupled in series in the path 28a. The same may be said of the transistor 20b and the switches 24b and 26b.

The paths 28a and 28b may be formed between the electric power source and at least one of the pair of differential output terminals VOM and VOP. In this case, the control circuit 50 uses any one of the switch signals SWP[n] and SWM[n] to control the threshold. Because the threshold is controlled in a wide range, the paths 28a and 28b may be formed between both of the pair of differential output terminals VOM and VOP and the electric power source. Other embodiments may include the same feature.

Embodiment 2

Figure 7:
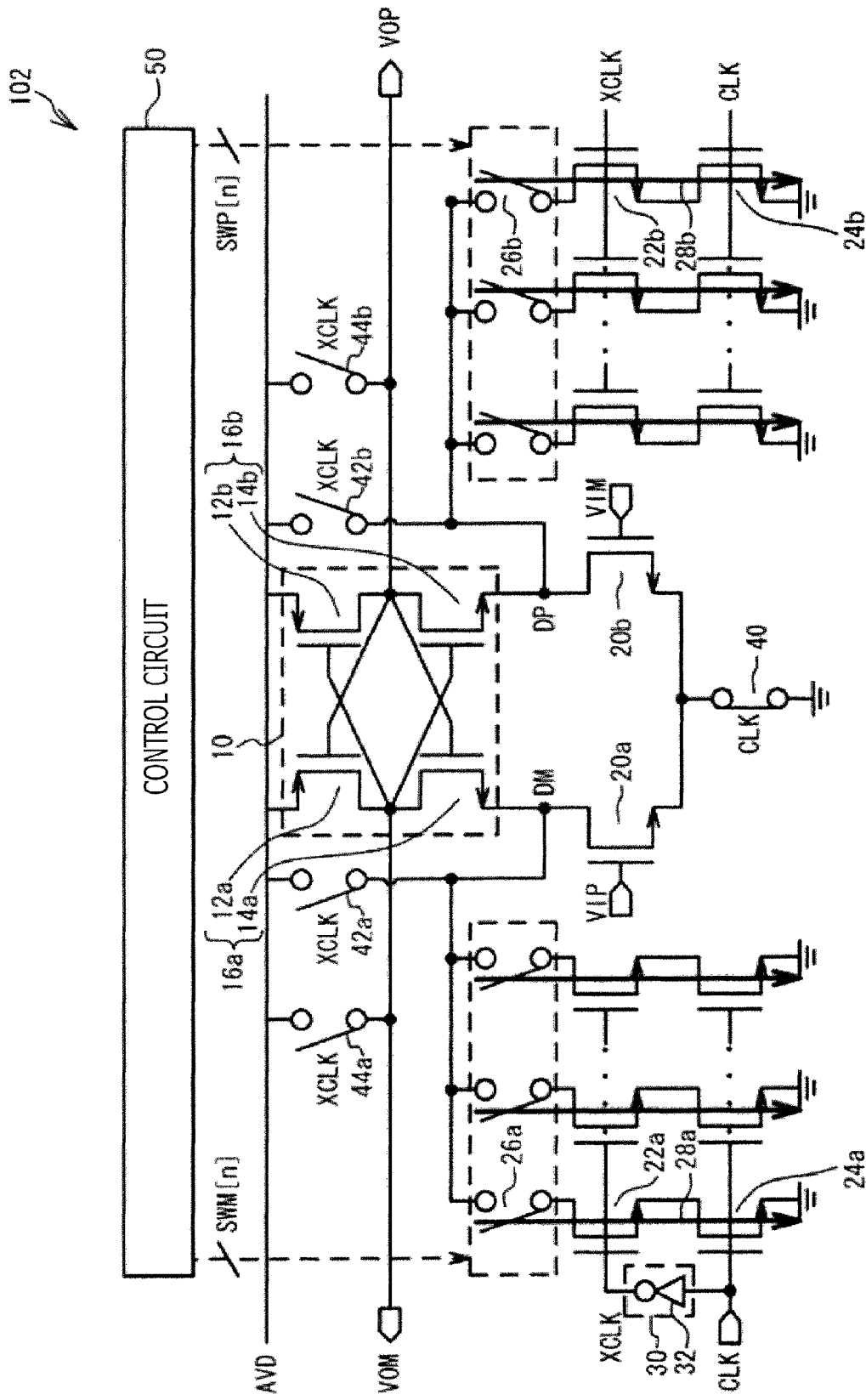
FIG. 7 is a circuit diagram of an electronic circuit according to a second embodiment.

FIG. 7 is a circuit diagram of an electronic circuit according to a second embodiment. As illustrated in FIG. 7, the paths 28a and 28b are respectively coupled to the nodes DM and DP in an electronic circuit 102. Other configurations are the same as those of the first comparative example and thus explanations thereof are omitted.

As described in the second embodiment, the pair of paths 28a and 28b may be provided between the grounds and the pair of nodes DM and DP. In this way, one end of the paths 28a and 28b may be coupled to nodes between the corresponding transistors 20a and 20b from at least one of the output terminals VOM and VOP, and the other end may be coupled to an electric power source such as a ground.

Embodiment 3

Figure 8:
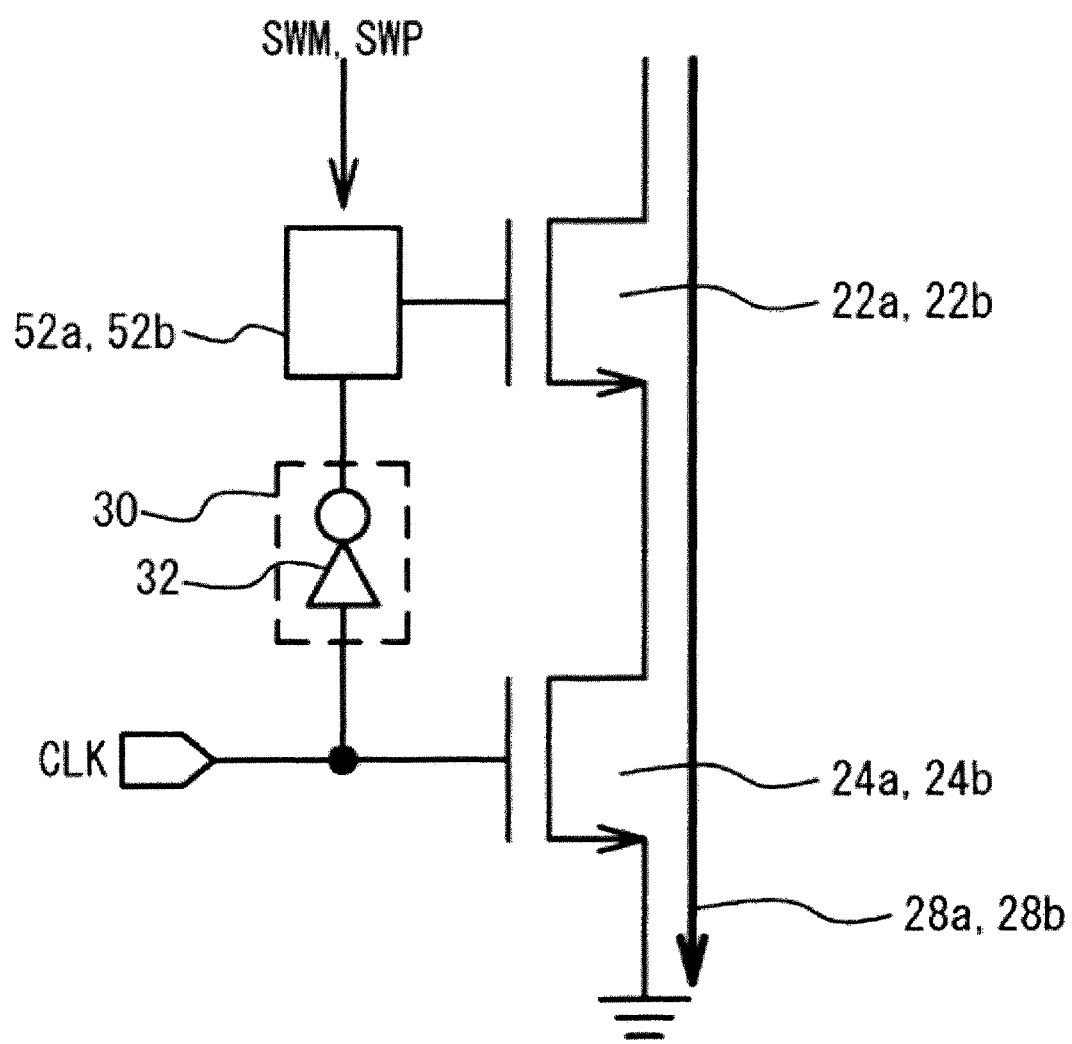
FIG. 8 is a circuit diagram illustrating the vicinity of a path in a third embodiment.

FIG. 8 is a circuit diagram illustrating the vicinity of a path in a third embodiment. As illustrated in FIG. 8, the switches 26a and 26b are not provided in the respective paths 28a and 28b of the third embodiment. Logical circuits 52a and 52b are respectively provided at the gates of the transistors 22a and 22b. The respective switch signals SWM and SWP and the signal XCLK are inputted to the logical circuits 52a and 52b. The logical circuits 52a and 52b respectively output the switch signals SWM and SWP and an AND signal of the signal XCLK. In this way, the transistors 22a and 22b turn ON when the switch signals SWM and SWP and the signal XCLK are at a high level.

Figure 9:
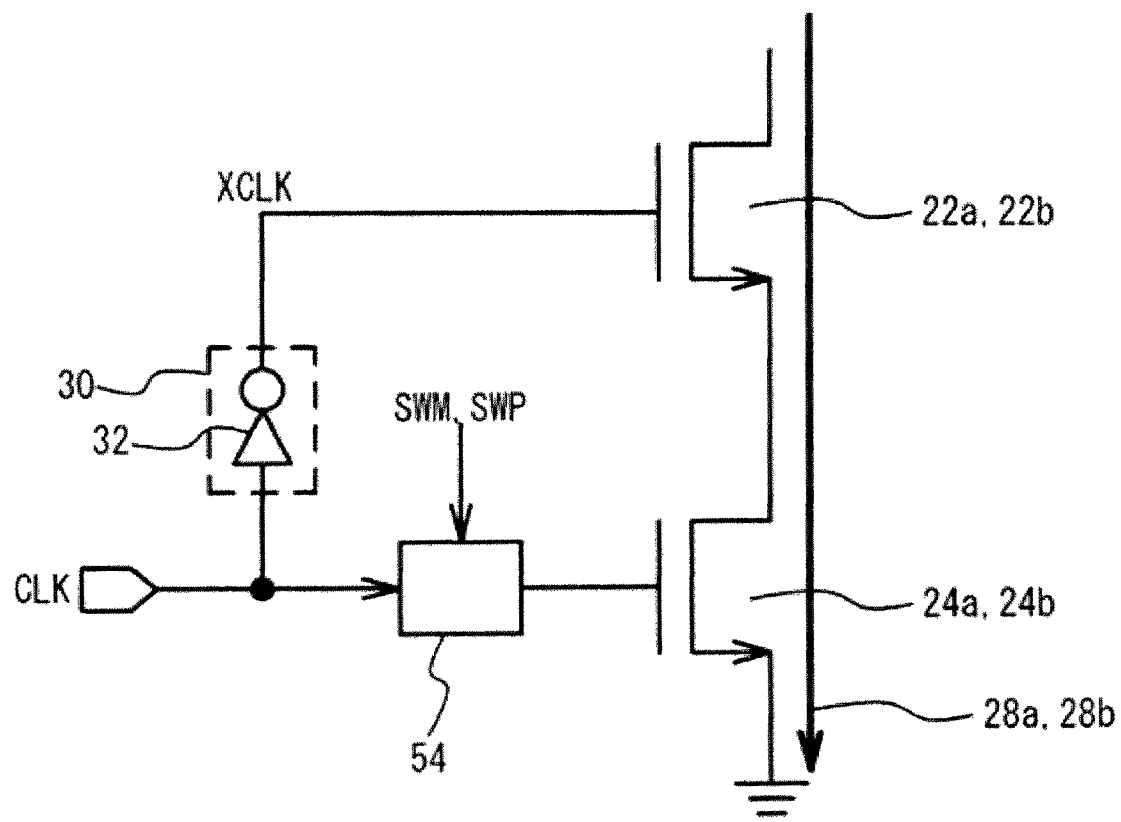
FIG. 9 is a circuit diagram illustrating the vicinity of a path in a modification of the third embodiment.

FIG. 9 is a circuit diagram illustrating the vicinity of a path in a modification of the third embodiment. As illustrated in FIG. 9, the switches 26a and 26b are not provided in the respective paths 28a and 28b of the modification of the third embodiment. Logical circuits 54a and 54b are respectively provided at the gates of the switches 24a and 24b. The respective switch signals SWM and SWP and the clock signal CLK are inputted to the logical circuits 54a and 54b. The logical circuits 54a and 54b respectively output the switch signals SWM and SWP and the AND signal of the clock signal CLK.

In this way, the switches 24a and 24b are turned ON when the switch signals SWM and SWP and the clock signal CLK are at a high level.

As in the third embodiment and the modification thereof, the control circuit 50 may cause at least either of the transistors 22a and 22b and the switches 24a and 24b corresponding to the paths 28a and 28b to be individually turned ON or OFF.

Embodiment 4

Figure 10:
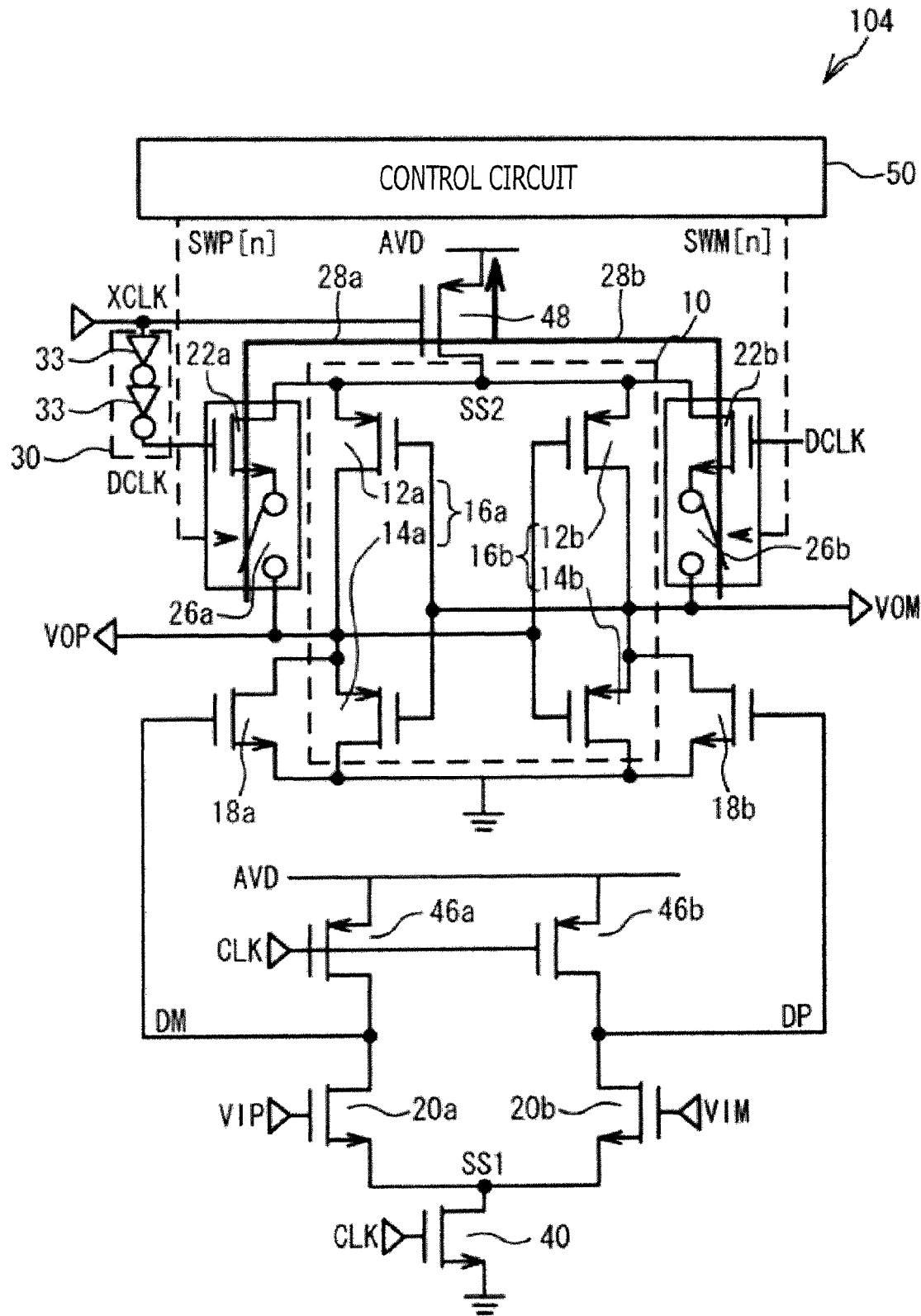
FIG. 10 is a circuit diagram of an electronic circuit according to a fourth embodiment.

FIG. 10 is a circuit diagram of an electronic circuit according to a fourth embodiment. As illustrated in FIG. 10, the sources of the transistors 20a and 20b which are n-type FETs are coupled to a shared node SS1. The node SS1 is coupled to a ground via the switch 40. The switch 40 is an n-type FET switch. The clock signal CLK is inputted to the gate of the switch 40. The drains of the transistors 20a and 20b are respectively coupled to the nodes DM and DP. Gates of the transistors 20a and 20b are respectively coupled to input terminals VIP and VIM. Transistors 46a and 46b are coupled between the nodes DM and DP and the electric power source AVD. The transistors 46a and 46b are p-type FETs. The clock signal CLK is inputted to the gates of the transistors 46a and 46b.

The first electric power source terminal of the bistable circuit 10 is coupled to a ground. The second electric power source terminal of the bistable circuit 10 is a node SS2. The node SS2 is coupled to the electric power source AVD via a transistor 48 (first switch). The transistor 48 is a p-type FET. The clock signal XCLK which is a complementary signal of the clock signal CLK is inputted to the gate of the transistor 48. Transistors 14a and 14b (third transistor) are respectively coupled in parallel to transistors 18a and 18b (fourth transistor). The transistors 18a and 18b are n-type FETs. The gates of the transistors 18a and 18b are respectively coupled to the nodes DM and DP.

The paths 28a and 28b are respectively formed between the electric power source AVD and the output terminals VOP and VOM. The transistor 22a and the switch 26a are coupled in series in the path 28a. The transistor 22b and the switch 26b are coupled in series in the path 28b. A plurality of each of the paths 28a and 28b are respectively provided as described in the first embodiment. The generation circuit 30 generates a delay signal DCLK as a control signal based on the clock signal XCLK, and outputs the delay signal DCLK to the gates of the transistors 22a and 22b. Inverting circuits 33 are coupled in stages of even numbers in the generation circuit 30. The switches 26a and 26b are turned ON or OFF based on the switch signals SWP[n] and SWM[n] outputted by the control circuit 50.

Figure 11:
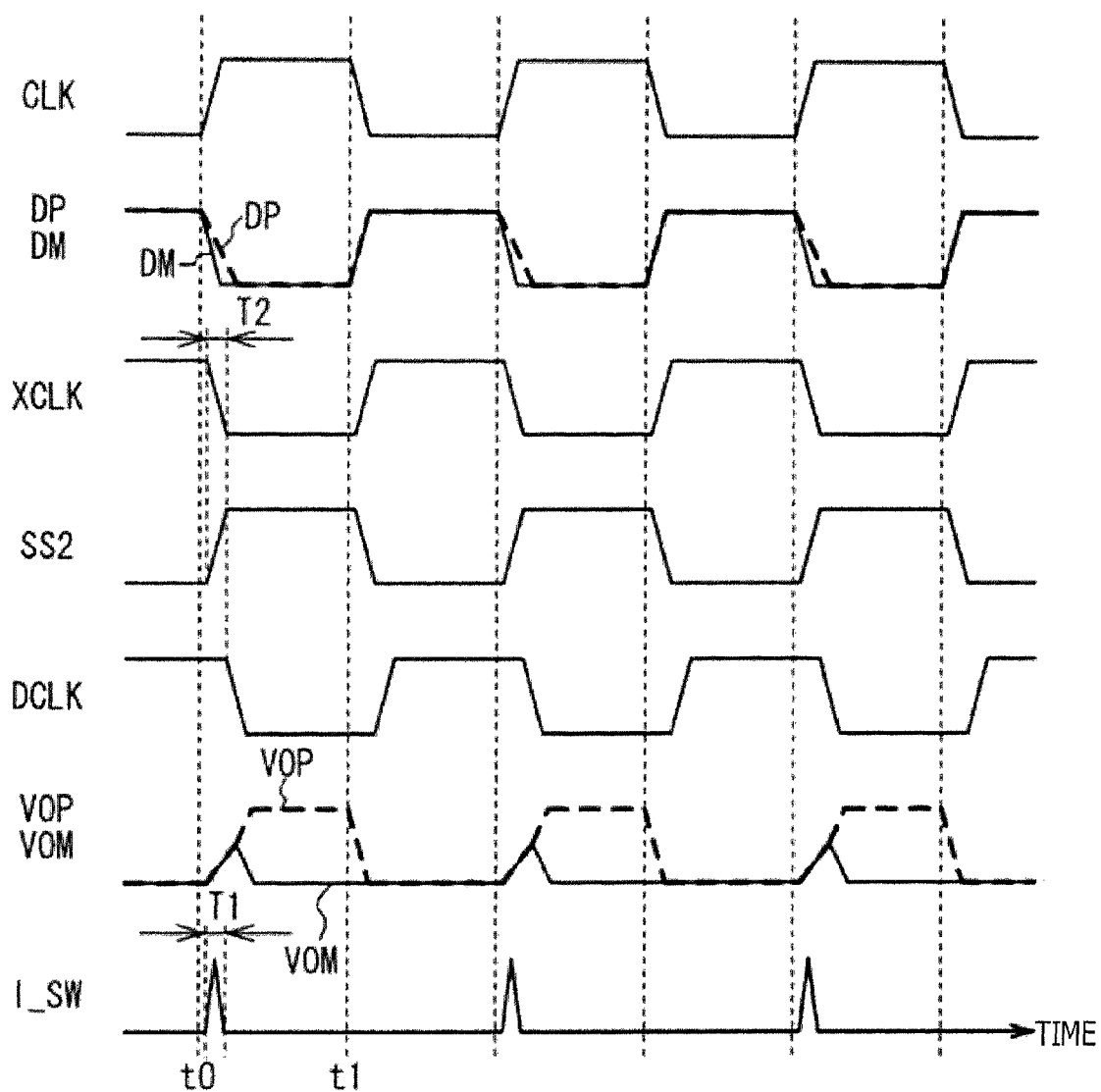
FIG. 11 is a timing chart of electric potentials and electric currents of the fourth embodiment.

FIG. 11 is a timing chart of electric potentials and electric currents in the fourth embodiment. The respective electric potentials of the clock signal CLK, the nodes DP and DM, the clock signal XCLK, the node SS2, the delay signal DCLK, and the output terminals VOP and VOM, and the electric currents flowing through the paths 28a and 28b are depicted in relation to time. As illustrated in FIG. 11, the switch 40 turns ON when the clock signal reaches a high level at the time t0. The electric potentials of the nodes DP and DM enter a low level in response to the conductance of the transistors 20a and 20b. At this time, the electric potential of the input terminal VIP is higher than that of the input terminal VIM, and the conductance of the transistor 20a is higher than that of the transistor 20b. The electric potential of the node DM reaches a low level earlier than the node DP.

The clock signal XCLK is a complementary signal of the clock signal CLK. When the clock signal XCLK reaches a low level, the transistor 48 turns ON and the node SS2 enters a high level. As a result, the bistable circuit 10 operates. The transistor 18a turns OFF earlier than the transistor 18b. When the electric potential of the output terminal VOM falls earlier than that of the output terminal VOP, the bistable circuit 10 is stabilized due to the output terminal VOM reaching a low level and the output terminal VOP reaching a high level.

The delay signal DCLK is delayed in comparison to the clock signal XCLK by the delay time period T2 of the generation circuit 30. Specifically, the fall of the delay signal DCLK is delayed in comparison to the fall of the clock signal CLK by the time period T2. Therefore, the time period T1 is developed in which both the transistor 22a and the transistor 48 are ON. During the time period T1, an electric current flows from the output terminal VOM through the path 28a to the ground. The same happens in the path 28b. The control circuit 50 controls which of the switches 26a and 26b turns ON and thus the threshold may be controlled at an earlier time in the comparing operation in the same way as the first embodiment.

As described in the fourth embodiment, the threshold may be controlled in a two-stage comparator. Moreover, the paths 28a and 28b may be coupled to the electric power source AVD. In this way, an electric charge may be added via the paths 28a and 28b. Furthermore, the paths 28a and 28b may be coupled to a ground and an electric power source (e.g., a direct current electric power source) having a voltage different than that of the electric power source AVD. Furthermore, the first switch may be provided in common for both of the transistors 22a and 22b.

The pair of transistors 22a and 22b (second transistor) and the first switch (switches 24a and 24b) are similar conductive type transistors in the first to third embodiments. In this case, the signal XCLK inputted to the gates of the transistors 22a and 22b is a signal that is delayed and inverted from the clock signal CLK that is inputted to the gates of the switches 24a and 24b.

The pair of transistors 22a and 22b (second transistor) and the first switch (transistor 40) are opposite conductive-type transistors in the fourth embodiment. In this case, the signal XCLK inputted to the gates of the transistors 22a and 22b is a signal that is delayed and inverted from the clock signal CLK that is inputted to the gates of the switches 24a and 24b.

Embodiment 5

Figure 12:
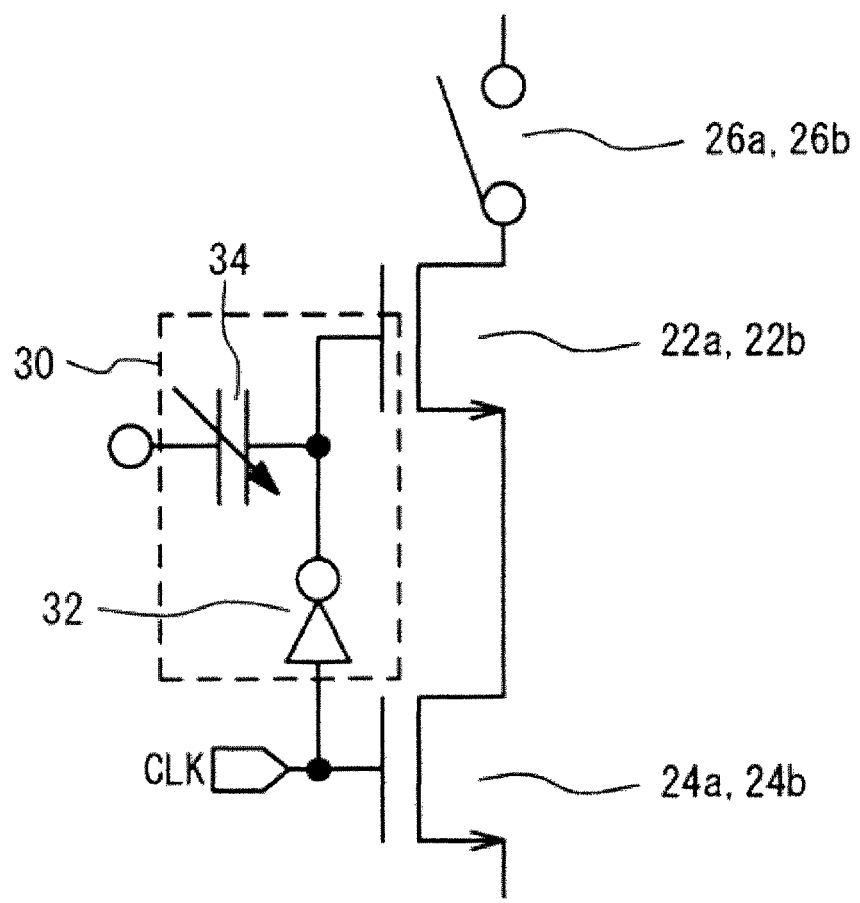
FIG. 12 is a circuit diagram illustrating the vicinity of a path in a fifth embodiment.

FIG. 12 is a circuit diagram illustrating the vicinity of a path in a fifth embodiment. As illustrated in FIG. 12, the generation circuit 30 is provided with the inverting circuit 32 and a variable capacitor 34. One end of the variable capacitor 34 is coupled between the inverting circuit 32 and the transistors 22a and 22b, and the other end is coupled to a fixed electric potential, for example. The control circuit 50 controls the capacity value of the variable capacitor 34.

Figure 13:
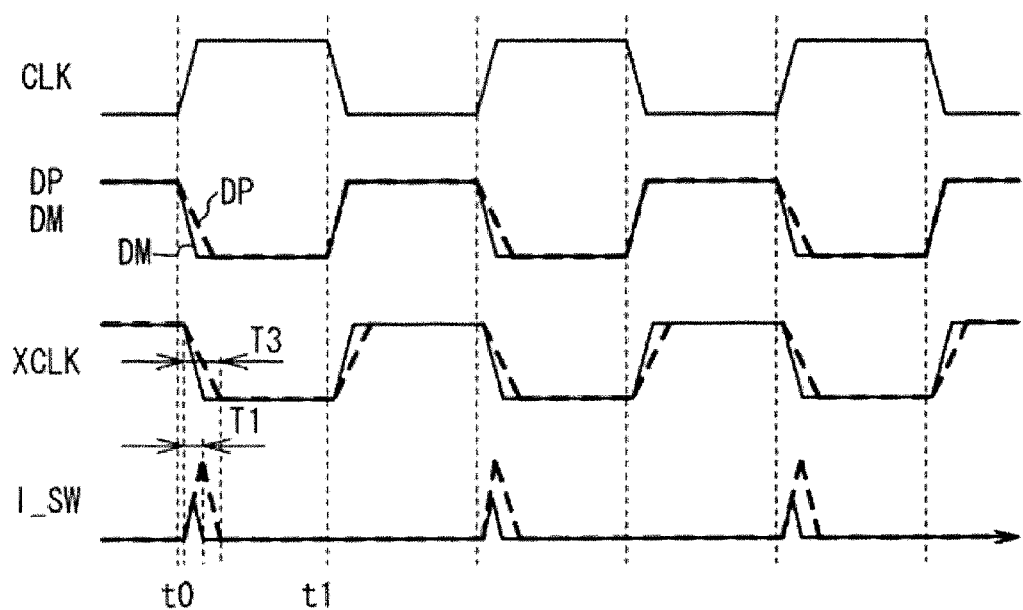
FIG. 13 is a timing chart of electric potentials and electric currents in the fifth embodiment.

FIG. 13 is a timing chart of electric potentials and electric currents in the fifth embodiment. The electric potential of the clock signal CLK, the electric potentials of the nodes DP and DM, the electric potential of the clock signal XCLK, the electric potentials of the output terminals VOP and VOM, and the electric currents flowing through the paths 28a and 28b are depicted in relation to time. As illustrated in FIG. 13, the solid lines of the signal XCLK and the electric current I_SW depict a case when the capacity value of the variable capacitor 34 is small, and the dashed lines thereof depict a case when the capacity value is large. When the control circuit 50 increases the capacity value of the variable capacitor 34, the rate of the fall of the clock signal XCLK is delayed as may be seen by the solid lines and the dashed lines. As a result, the time period during which the electric current I_SW is flowing is lengthened from the time period T1 to a time period T3 and the electric current I_SW becomes larger.

As described in the fifth embodiment, the generation circuit 30 generates the clock signal XCLK by delaying the displacement speed of the clock signal CLK. The control circuit 50 is able to control the threshold of the comparator by controlling the displacement speed of the generation circuit 30.

Embodiment 6

Figure 14:
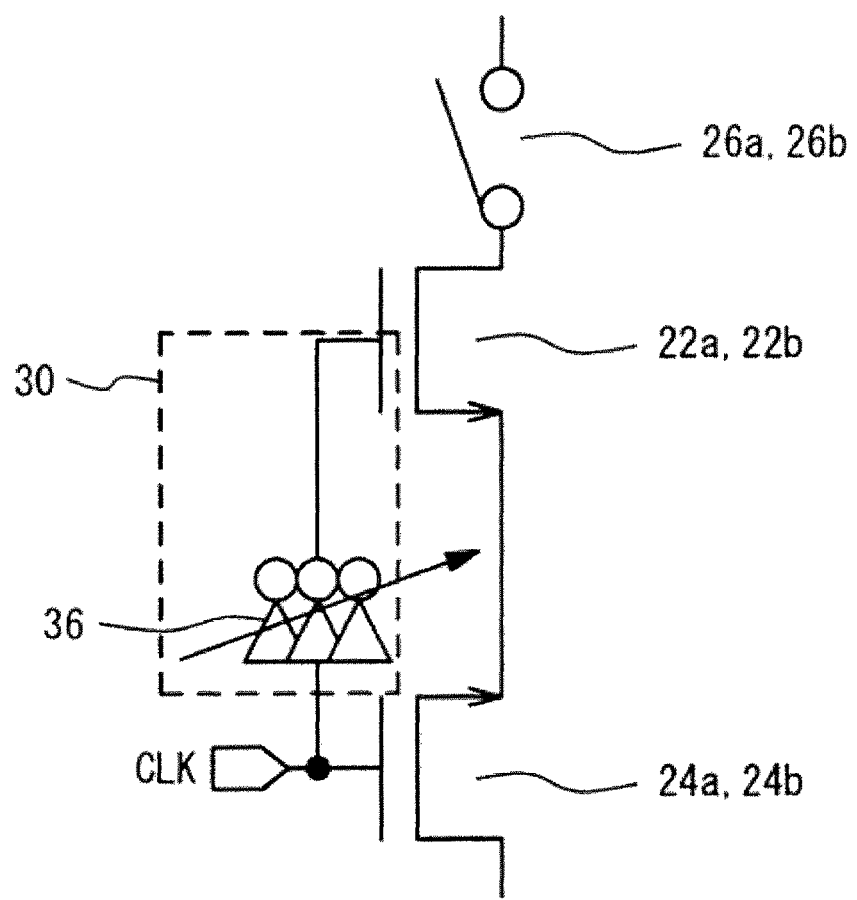
FIG. 14 is a circuit diagram illustrating the vicinity of a path in a sixth embodiment.

FIG. 14 is a circuit diagram illustrating the vicinity of a path in a sixth embodiment. As illustrated in FIG. 14, the generation circuit 30 is provided with inverting circuits 36. The control circuit 50 changes the size or the number of the inverting circuits 36 coupled in parallel.

Figure 15:
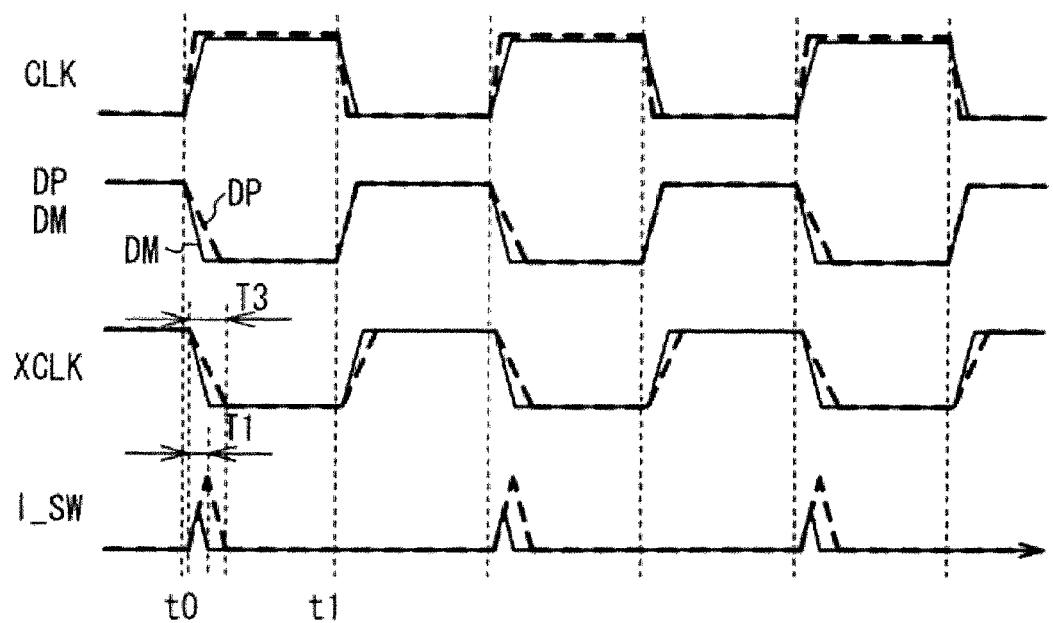
FIG. 15 is a timing chart of electric potentials and electric currents in the sixth embodiment.

FIG. 15 is a timing chart of electric potentials and electric currents in the sixth embodiment. The electric potential of the clock signal CLK, the electric potentials of the nodes DP and DM, the electric potential of the clock signal XCLK, the electric potentials of the output terminals VOP and VOM, and the electric currents flowing through the paths 28*a* and 28*b* are depicted in relation to time. As illustrated in FIG. 15, the solid lines of the signals CLK and XCLK and the electric current I_SW represent a case in which the size or the number of the inverting circuits 36 coupled in parallel is small, and the dashed lines thereof represent a case in which the size of the inverting circuits 36 is larger or the number of the inverting circuits 36 coupled in parallel is greater. When the control circuit 50 increases the size or the number of the inverting circuits 36 coupled in parallel, the rate of the fall of the clock signal XCLK is delayed as may be seen by the solid lines and the dashed lines. The rate of the rise of the clock signal CLK is faster. As a result, the time period during which the electric current I_SW is flowing is lengthened from the time period T1 to the time period T3 and the electric current I_SW becomes larger.

As described in the sixth embodiment, the generation circuit 30 generates the clock signal XCLK by delaying the displacement speed of the clock signal CLK. The control circuit 50 is able to control the threshold of the comparator by controlling the displacement speed of the generation circuit 30.

Embodiment 7

Figure 16:
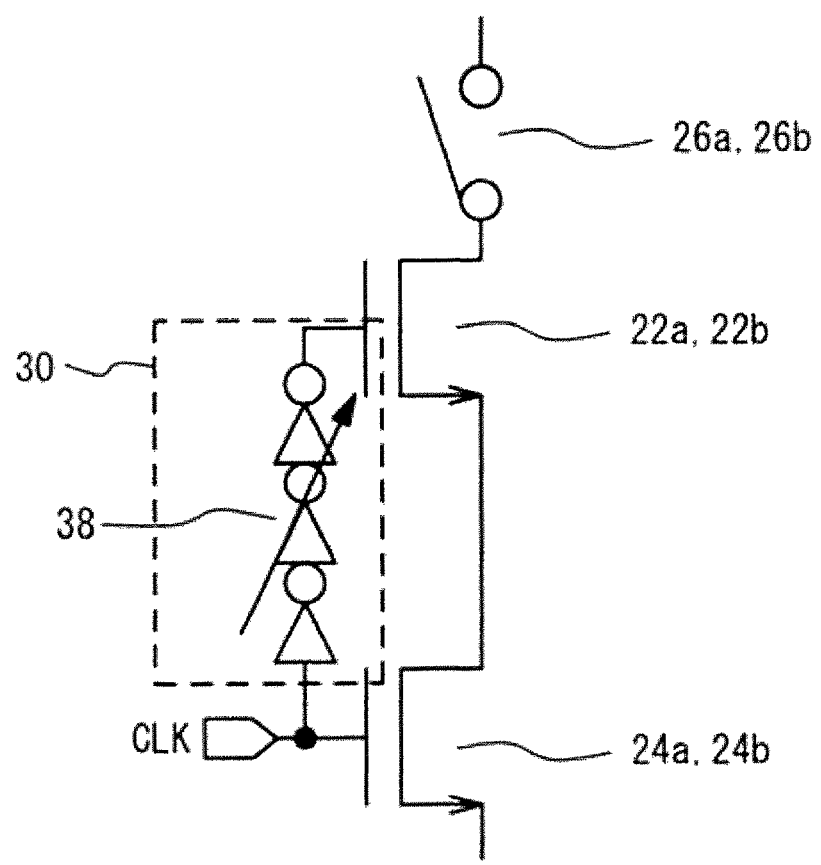
FIG. 16 is a circuit diagram illustrating the vicinity of a path in a seventh embodiment.

FIG. 16 is a circuit diagram illustrating the vicinity of a path in a seventh embodiment. The generation circuit 30 is provided with inverting circuits 38 coupled in series. The control circuit 50 changes the number of the inverting circuits 38 coupled in series.

Figure 17:
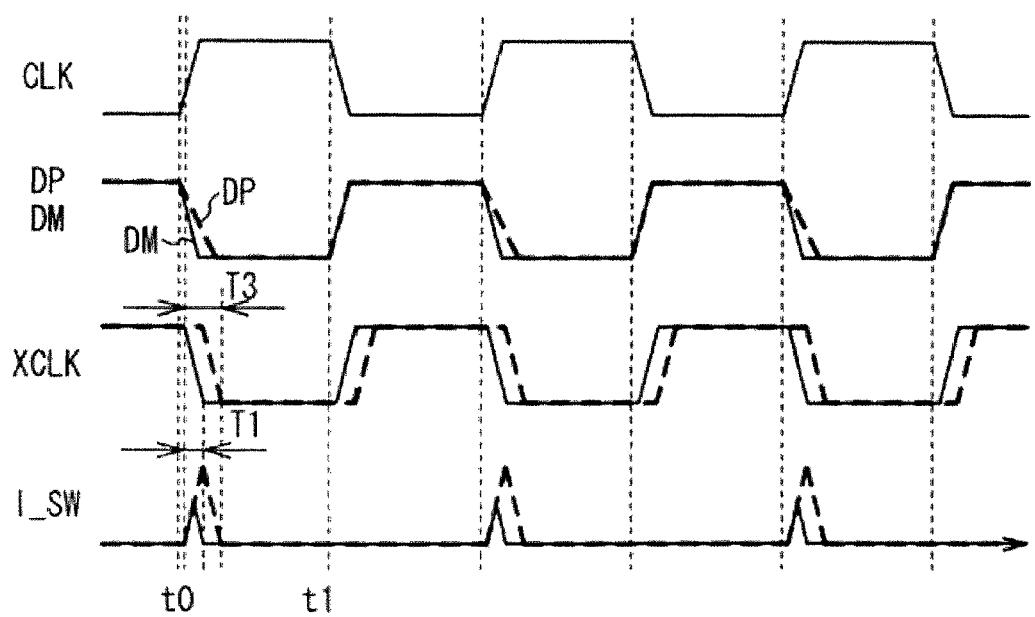
FIG. 17 is a timing chart of electric potentials and electric currents of the seventh embodiment.

FIG. 17 is a timing chart of electric potentials and electric currents in the seventh embodiment. The electric potential of the clock signal CLK, the electric potentials of the nodes DP and DM, the electric potential of the clock signal XCLK, the electric potentials of the output terminals VOP and VOM, and the electric currents flowing through the paths 28*a* and 28*b* are depicted in relation to time. As illustrated in FIG. 17, the solid lines of the signal XCLK and the electric current I_SW represent a case in which the number of the inverting circuits 38 coupled in series is small, and the dashed lines thereof represent a case in which the number of the inverting circuits 38 coupled in series is greater. When the control circuit 50 increases the number of the inverting circuits 38 coupled in series, the rate of the fall of the clock signal XCLK is delayed as may be seen by the solid lines and the dashed lines. As a result, the time period during which the electric current I_SW is flowing is lengthened from the time period T1 to the time period T3 and the electric current I_SW becomes larger.

As described in the seventh embodiment, the generation circuit 30 generates the clock signal XCLK by delaying the clock signal CLK. The control circuit 50 is able to control the threshold of the comparator by controlling the delay amount of the generation circuit 30.

According to the fifth to seventh embodiments, the threshold of the comparator may be controlled by the control circuit 50 controlling the generation circuit 30. When the fifth to seventh embodiments are used, the paths 28*a* and 28*b* may respectively be provided as one each or as a plurality thereof. By combining the first to fourth embodiments with the fifth to seventh embodiments, the threshold may be controlled in a greater range.

The transistors and switches in the first to seventh embodiments are described as FETs as an example, and other types of transistors and switches may be used. Moreover, n-type FETs and p-type FETs have been described as examples. However, the n-type FETs and p-type FETs may be reversed and a complementary circuit may be used in accordance with the circuitry. Furthermore, the order of the transistors and switches coupled in series may be different.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic circuit comprising:
a pair of first transistors in which a first control signal is inputted to at least one of a first control terminal;
a comparator circuit that sets electric potentials of a pair of differential output terminals based on an electric current flowing through the pair of first transistors;
second transistors that are coupled in series in a path between an electric power source and a node from at least one of the pair of differential output terminals and between the corresponding pair of first transistors, and having a second control terminals to which a second control signal is inputted;
first switches that are respectively coupled in series to the second transistors in the path and that are turned ON in synchronization with a clock signal; and
a generation circuit that generates the second control signal based on the clock signal so that the second transistors are turned ON with a delay in comparison to the first switches.

2. The electronic circuit according to claim 1, wherein the second transistors are respectively a plurality of second transistors.

3. The electronic circuit according to claim 2, further comprising a plurality of second switches respectively coupled in series to the plurality of second transistors; and
a control circuit that individually causes the plurality of second switches to be turned ON or OFF.

4. The electronic circuit according to claim 3, wherein the control circuit includes a control circuit that turns at least either of the second transistors and the first switches ON or OFF individually.

5. The electronic circuit according to claim 1, wherein the generation circuit includes a control circuit that generates the second control signal by delaying the clock signal, and controls the delay amount of the generation circuit.

6. The electronic circuit according to claim 1, wherein the generation circuit includes a control circuit that generates the second control signal by delaying a displacement speed of the clock signal, and controls the displacement speed of the generation circuit.

7. The electronic circuit according to claim 1, wherein a first terminal of the first transistor is coupled to a first electric power source, and a second terminal of the first transistor is coupled to a second electric power source having a voltage different from that of the first electric power source.

8. The electronic circuit according to claim 7, wherein the comparator circuit is provided with a bistable circuit having a pair of inverters, and a pair of first electric power source terminals of the bistable circuit are coupled to the second electric power source, and a pair of second electric power source terminals of the bistable circuit are respectively coupled to the second terminals of the first transistor, and a pair of output terminals of the bistable circuit are the pair of differential output terminals.

9. The electronic circuit according to claim 7, wherein the comparator circuit is provided with a bistable circuit having a pair of inverters, and the second terminals of the pair of first transistors are respectively coupled to control terminals of fourth transistors coupled in parallel to a pair of third transistors included respectively in the pair of inverters, and a pair of output terminals of the bistable circuit are the differential output terminals.

* * * * *